United States Patent
Chen et al.

(10) Patent No.: US 6,177,332 B1
(45) Date of Patent: Jan. 23, 2001

(54) METHOD OF MANUFACTURING SHALLOW TRENCH ISOLATION

(75) Inventors: Coming Chen, Taoyuan Hsien; Jih-Wen Chou, Hsinchu, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/208,624

(22) Filed: Dec. 8, 1998

(30) Foreign Application Priority Data

Sep. 14, 1998 (TW) .................................................. 87115248

(51) Int. Cl.⁷ ..................................................... H01L 21/76
(52) U.S. Cl. ............................. 438/429; 438/424; 438/296
(58) Field of Search .................... 438/429, 424, 438/296

(56) References Cited

U.S. PATENT DOCUMENTS

| | | | |
|---|---|---|---|
| 4,551,910 | * 11/1985 | Patterson | 29/571 |
| 4,689,656 | * 8/1987 | Silvestri et al. | 438/429 |
| 4,758,531 | * 7/1988 | Beyer et al. | 438/429 |
| 5,236,863 | * 8/1993 | Iranmanesh | 438/429 |
| 5,384,280 | * 1/1995 | Aoki et al. | 438/429 |
| 5,716,868 | * 2/1998 | Nagai | 438/429 |
| 6,020,230 | * 2/2000 | Wu | 438/429 |

FOREIGN PATENT DOCUMENTS

08306797  * 11/1996  (JP) ............................. H01I/21/8234

* cited by examiner

Primary Examiner—Charles Bowers
Assistant Examiner—David S Blum
(74) Attorney, Agent, or Firm—Charles C. H. Wu; Charles C. H. Wu & Associates

(57) ABSTRACT

A method is described for manufacturing a shallow trench isolation. The method comprises the steps of providing a substrate having a pad oxide layer, a mask layer and a trench, wherein the trench penetrates through the mask layer and the pad oxide layer and into the substrate. A liner oxide layer is formed on a portion of the sidewall of the trench in the substrate. A silicon layer is formed in the trench with a same surface level as the interface between the substrate and the pad oxide layer and an insulating layer is formed on the silicon layer.

16 Claims, 4 Drawing Sheets

METHOD OF MANUFACTURING SHALLOW TRENCH ISOLATION

BACKGROUND OF THE INVENTION

1. Field of the Invention

The present invention relates to a method of manufacturing a semiconductor device. More particularly, the present invention relates to a method of manufacturing an isolation region.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs. Conventionally, the local oxidation of silicon (LOCOS) technique is widely utilized in semiconductor industry to provide isolation regions among the various devices in the substrate. Since the LOCOS technique has been used for quiet a period of time, it is one of the most reliable and low-cost methods for fabricating device isolation region. However, there are still some drawbacks of the LOCOS. The drawbacks include internal stress generation and bird's beak encroachment. For a highly integrated device, the problem of bird's beak encroachment by isolation regions is especially difficult to avoid; thus the isolation regions cannot effectively isolate devices.

Shallow trench isolation (STI) technique is the other conventional method of forming isolation regions. Shallow trench isolation is formed by first anisotropically etching to form a trench in the substrate, and then depositing an oxide layer in the trench and on the substrate. Next, a chemical-mechanical polishing step is used to planarize the oxide layer and to form an STI region. Therefore, the problem induced by the bird's beak can be overcome. As line width becomes smaller and integration becomes higher, STI is an ideal and scaleable isolation technique.

FIGS. 1A through 1D are schematic, cross-sectional views of the conventional process for manufacturing an STI.

As shown in FIG. 1A, a substrate 100 is provided. There are a pad oxide layer 102 and a mask layer 104 on the substrate, and a trench 106 penetrate through the mask layer 104 and the pad oxide layer 102 and into the substrate 100. A liner oxide layer 108 is conformally formed on the bottom surface and a portion of the sidewall of the trench 106 in the substrate 100.

As shown in FIG. 1B, an insulating layer 110 is formed over the substrate and filling the trench 106. A densification step is used to increase the density of the insulating layer 110.

As shown in FIG. 1C, a chemical-mechanical polishing (CMP) step is used to planarize the insulating layer 110 until the surface of the mask layer 104 is exposed and to form an STI 112.

As shown in FIG. 1D, the mask layer 104 and the pad oxide layer 102 are removed in sequence.

When the CMP step is performed, since the insulating layer 110 is softer than the mask layer 104, the surfaces 114a and 114b of the STI 112 manifest dishing (as shown in FIG. 1C). Moreover, since the polishing rates are different between the dense region 116a and the thin region 116b of the STI 112, the recess of the surface 114b in the thin region 116b is deeper than that of the surface 114a in the dense region 116a. Therefore, the nonuniformity of the thickness of the STI affects the subsequent process. Additionally, the slurry reagent used in CMP can react with the wafer, and then the abrasive particles polish the rough surface. Since the abrasive particles scratch the surface to form microscratches, the bridging effect occurs in subsequent process.

To improve the dishing induced by CMP, many methods are developed, such as reverse mask technique and dummy pattern technique. But the methods mentioned above all require an increase in photolithography and etching steps. The process for manufacturing the STI is more complicated and the costs are increased.

SUMMARY OF THE INVENTION

It is therefore an objective of the invention to provide a method of manufacturing a shallow trench isolation. The invention can overcome the problems caused by CMP such as the dishing effect and the nonuniform thickness of the STI.

It is another an objective of the invention to provide a method of manufacturing a shallow trench isolation. The invention can overcome the problems of microscratches on the surface of the STI induced by CMP.

To achieve these and other advantages and in accordance with the purpose of the invention, as embodied and broadly described herein, the invention provides a method of manufacturing a shallow trench isolation comprising the steps of providing a substrate having a pad oxide layer, a mask layer and a trench, wherein the trench penetrate through the mask layer and the pad oxide layer and into the substrate. A liner oxide layer is formed on a portion of the sidewall of the trench in the substrate. A silicon layer is formed in the trench with a surface level with the interface between the substrate and the pad oxide layer and an insulating layer is formed on the silicon layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve explain the principles of the invention. In the drawings.

DESCRIPTION OF THE PREFERRED EMBODIMENTS

Figure 1A:
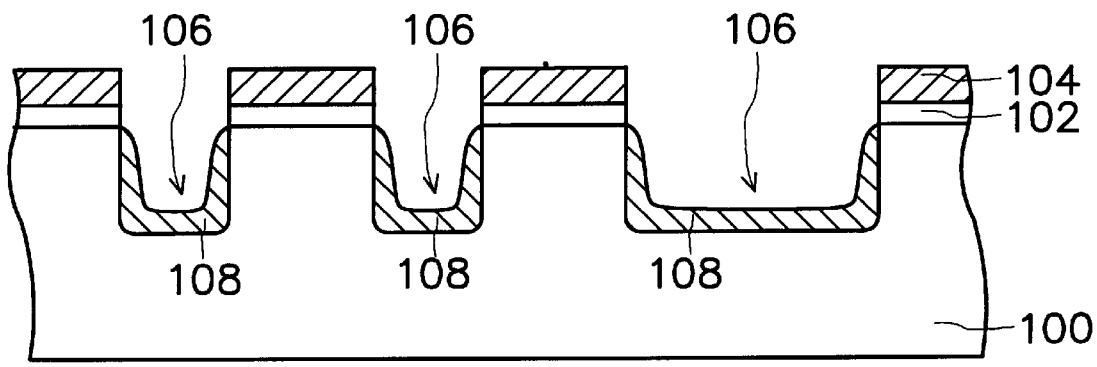
FIGS. 1A through 1D are schematic, cross-sectional views of the conventional process for manufacturing an STI.
Figure 1B:
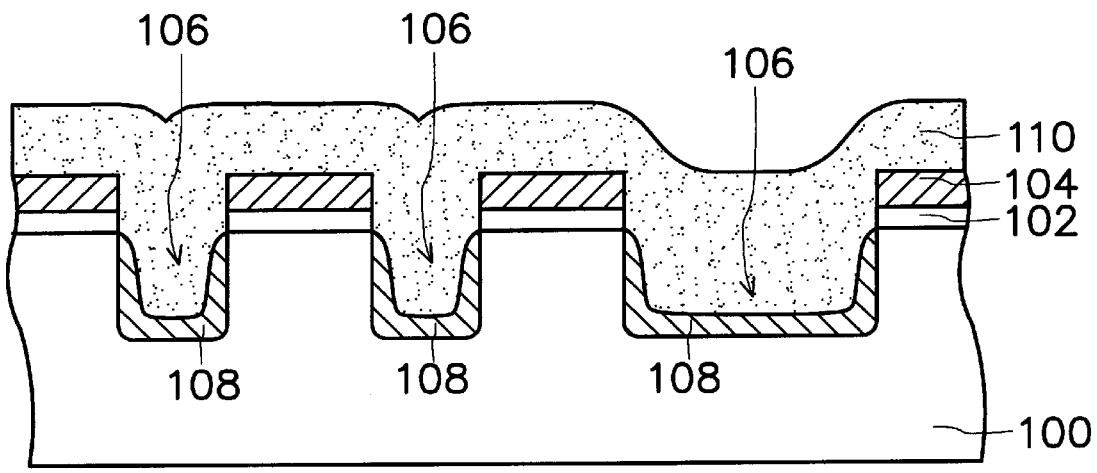
Figure 1C:
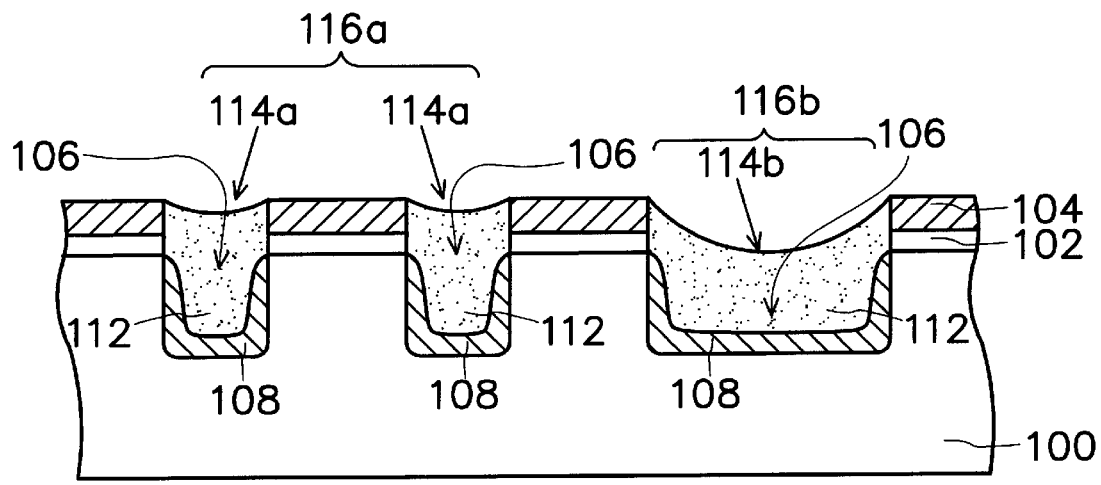
Figure 1D:
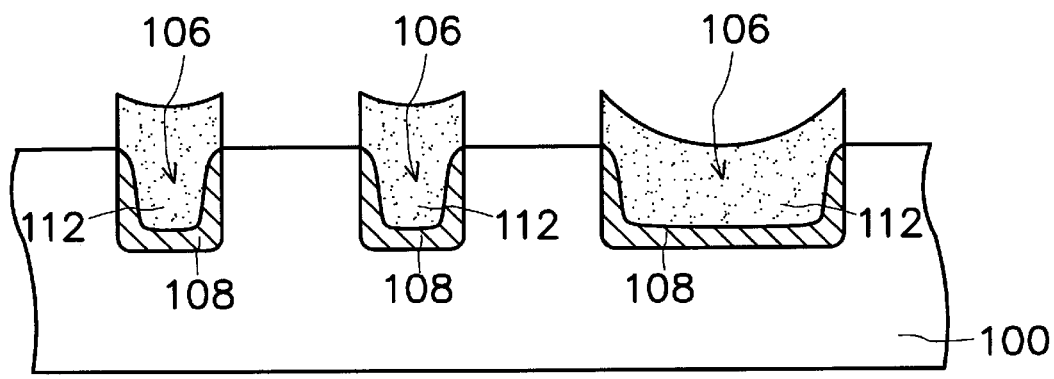

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views of the process for manufacturing an STI in a preferred embodiment according to the invention.

Figure 2A:
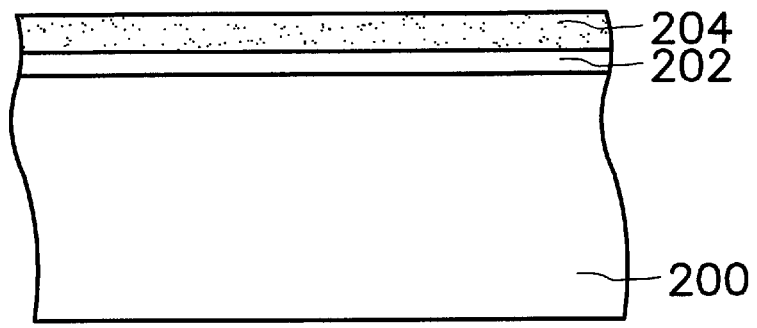
FIGS. 2A through 2F are schematic, cross-sectional views of the process for manufacturing an STI in a preferred embodiment according to the invention.

First, as shown in FIG. 2A, a pad oxide layer 202 and a mask layer 204 are sequentially formed on a substrate 200. The pad oxide layer 202 can be formed by thermal oxidation, for example. The pad oxide layer 202 is used to protect the substrate 200 from damage caused by the subsequent etching process. The mask layer 204 can be a silicon nitride layer formed by chemical vapor deposition, for example.

Figure 2B:
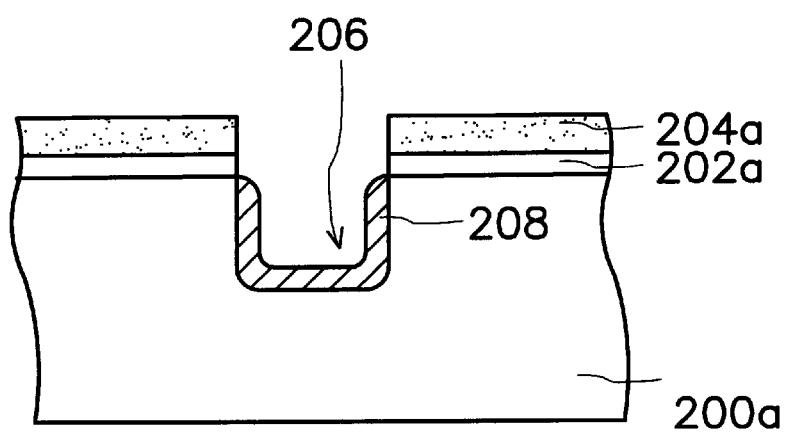

As shown in FIG. 2B, a trench 206 is formed by patterning the mask layer 204, the pad oxide layer 202 and the substrate 200. The mask layer 204, the pad oxide layer 202 and the substrate 200 are transformed into a mask layer 204a, a pad oxide layer 202a and a substrate 200a. A liner oxide layer 208 is conformally formed on the bottom surface and a portion of the sidewall of the trench 206 in the substrate 200. The liner oxide layer can be formed by thermal oxidation at a temperature of about 850–950 degrees centigrade, for example.

Figure 2C:
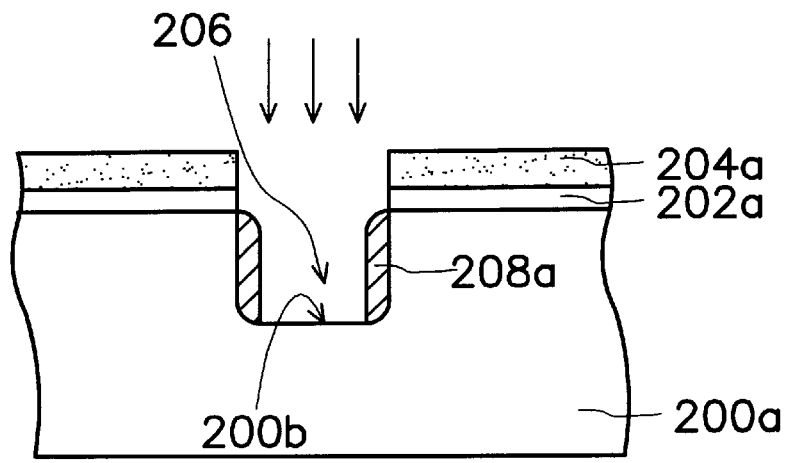

As shown in FIG. 2C, a liner oxide layer 208a is formed by removing a portion of the liner oxide layer 208 until the bottom surface 200b of the trench 206 in the substrate 200 is exposed. The liner oxide layer 208a remains on a portion of the sidewalls of the trench 206 in the substrate 200. The method for removing the bottom portion of the liner oxide layer 208 can be dry etching, for example.

Figure 2D:
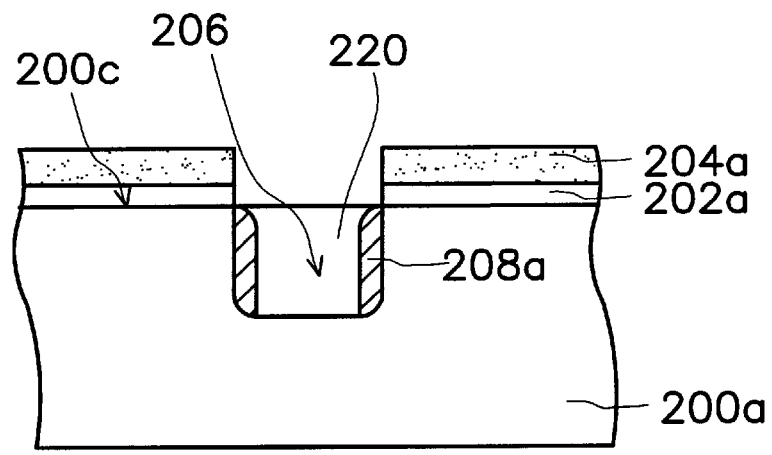

As shown in FIG. 2D, a silicon layer 220 is formed to fill the trench 206. The surface of silicon layer 220 is level with the interface 200c between the substrate 200 and the pad oxide layer 202a. The silicon layer 220 can be a monosilicon layer or a polysilicon layer. In this example, the method for forming the silicon layer 220 comprises the steps of using the mask layer 204a as a self-aligned mask. And then, the bottom surface 200b is used as a seed for performing an epitaxy step. One characteristic of the invention is that CMP is no longer needed to planarize the silicon layer 220, because the growth of the silicon layer 220 is well controlled and its surface is easily formed level with the interface 200c. Therefore, the problems caused by CMP such as the dishing effect, the nonuniformity of the thickness of the STI and microscratches on the surface of the STI are eliminated. Additionally, by forming the silicon layer 220 in the trench 206, the problem of latch-up can be avoided.

Figure 2E:
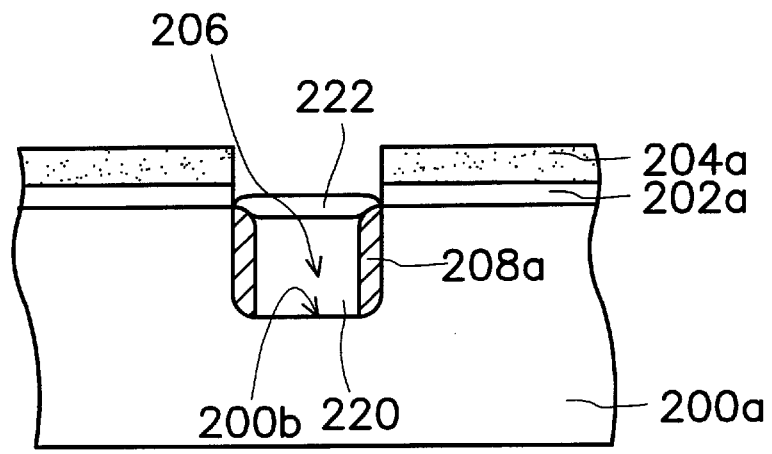

As shown in FIG. 2E, an insulating layer 222 is formed on the silicon layer 220 to protect the silicon layer 220 against the ion implantation of the subsequent process. In this example, the insulating layer 222 can be a silicon oxide layer and the method for forming the insulating layer 222 includes wet oxidation coordinated with dry oxidation. First, a thin oxide layer (not shown) is formed on the silicon layer 220 by dry oxidation, and then a wet oxidation step is used to grow a silicon oxide layer from the thin oxide layer in a humid condition.

Figure 2F:
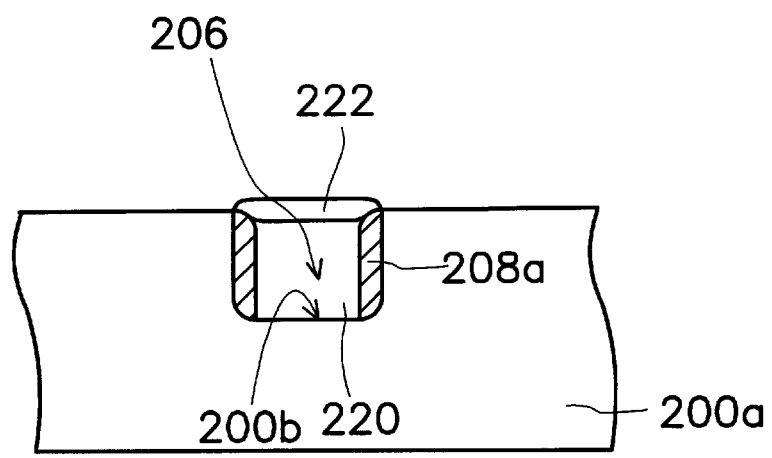

As shown in FIG. 2F, the mask layer 204a and the pad oxide layer 202a are removed in sequence. The method for removing the mask layer 204a includes wet etching or dry etching.

In the preferred embodiment according to the invention, a portion of the liner oxide layer 208 is removed to form the liner 208a on the a portion of the sidewall of the trench 206 in the substrate 200. The silicon layer 220 is formed to fill the trench 206, so that the surface of silicon layer 200 is level with the interface 200c. It is unnecessary to planarize the silicon layer 220 by CMP. Thus, the problems caused by CMP such as the dishing effect, the nonuniformity of the thickness of the STI and microscratches on the surface of the STI are eliminated. Moreover, by forming the silicon layer 220 in the trench 206, the effect of latch-up can be avoided.

Altogether, the characteristics of the present invention include the following:

1. In the invention, since a silicon layer is formed to fill the trench, it is unnecessary to planarize the silicon layer by CMP. The problems caused by CMP such as the dishing effect, the nonuniformity of the thickness of the STI and the microscratches on the surface of the STI can be overcome.
2. In the invention, since a silicon layer is formed to fill the trench and an insulating layer is formed on the silicon layer, the problem of latch-up can be avoided.
3. Comparing the invention with the reverse mask technique and dummy pattern technique, the invention skips the photolithography and etching steps. The process of manufacturing the STI is simplified and the cost is reduced.
4. The present invention and the conventional process techniques are compatible; thus the present invention is suitable for the manufacturers to utilize.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a shallow trench isolation suitable for a substrate having a pad oxide layer, a mask layer and a trench having a sidewall and an exposed bottom surface, wherein the trench penetrates through the mask layer and the pad oxide layer and into the substrate, the method comprising the steps of:

forming a liner oxide on a portion of the sidewall of the trench in the substrate;

forming a silicon layer having a top surface in the trench by an epitaxy step, wherein the exposed bottom surface of the trench is used as a seed for the epitaxy step, wherein the surface of the silicon layer is level with the interface between the substrate and the pad oxide layer; and forming an insulating layer only on the top surface of the filled silicon layer in the trench by a dry oxidation step and a sequential wet oxidation layer without performing deposition.

2. The method of claim 1, wherein the silicon layer includes a monosilicon layer.

3. The method of claim 2, wherein the step of forming the insulating layer includes wet oxidation coordinated with dry oxidation.

4. The method of claim 1, wherein the silicon layer includes a polysilicon layer.

5. The method of claim 4, wherein the step of forming the insulating layer includes wet oxidation coordinated with dry oxidation.

6. The method of claim 1, wherein the step of forming the silicon layer includes epitaxy.

7. The method of claim 1, wherein the insulating layer includes a silicon oxide layer.

8. The method of claim 1, wherein the step of forming the insulating layer includes wet oxidation coordinated with dry oxidation.

9. The method of claim 1, wherein the step of forming the liner oxide layer further comprises the steps of:

forming a liner oxide layer on the bottom surface and a portion of the sidewall of the trench; and stripping away a portion of the liner oxide layer to expose the bottom surface of the trench.

10. The method of claim 9, wherein the step of stripping away a portion of the liner oxide layer includes dry etching.

11. The method of claim 1, wherein the step of forming the liner oxide layer includes thermal oxidation.

12. The method of claim 1, wherein the mask layer includes a silicon nitride layer.

13. The method of claim 1, further comprising, after the step of forming the insulating layer the step of stripping away the mask layer and the pad oxide layer.

14. The method of claim 13, wherein the step of stripping away the mask layer includes wet etching.

15. The method of claim 13, wherein the step of stripping away the mask layer includes dry etching.

16. The method of claim 13, wherein the step of stripping away the liner oxide layer includes wet etching.

* * * * *